United States Patent [19]

Banerjee et al.

[11] Patent Number: 5,221,854

[45] Date of Patent: Jun. 22, 1993

[54] PROTECTIVE LAYER FOR THE BACK REFLECTOR OF A PHOTOVOLTAIC DEVICE

[75] Inventors: Arindam Banerjee, Madison Heights; Subhendu Guha; Chi C. Yang, both of Troy, all of Mich.

[73] Assignee: United Solar Systems Corporation, Troy, Mich.

[21] Appl. No.: 795,944

[22] Filed: Nov. 18, 1991

[51] Int. Cl.$^5$ .................... H01L 27/14; H01L 31/00
[52] U.S. Cl. ............................ 257/431; 257/435; 257/449; 136/256
[58] Field of Search .............. 357/30 D, 30 J, 30 K, 357/30 L, 2; 136/246, , 249 TJ, 249 MS, 256; 257/431, 435, 449

[56] References Cited

U.S. PATENT DOCUMENTS

| | | | |
|---|---|---|---|
| 4,379,943 | 4/1983 | Yang et al. | 136/249 TJ |
| 4,419,533 | 12/1983 | Czubatyj et al. | 136/249 TJ |
| 4,492,810 | 1/1985 | Ovshinsky et al. | 357/30 K |
| 4,514,583 | 4/1985 | Izu et al. | 136/249 TJ |
| 4,598,164 | 7/1986 | Tiedje et al. | 136/249 TJ |
| 5,034,068 | 7/1991 | Glenn et al. | 136/256 |

FOREIGN PATENT DOCUMENTS

| | | | |
|---|---|---|---|
| 61-180487 | 8/1986 | Japan | 136/256 |
| 1-236661 | 9/1989 | Japan | 136/256 |
| 3-62973 | 3/1991 | Japan | 136/256 |

Primary Examiner—Rolf Hille
Assistant Examiner—Minhloan Tran
Attorney, Agent, or Firm—Krass & Young

[57] ABSTRACT

A protective layer is disposed between a silver reflective electrode and a layer of transparent conductive oxide in a photovoltaic device so as to prevent oxidation of the silver. The protective layer may be continuous or discontinuous and may be fabricated from $MgF_2$, $Si_x N_y$ or $Ti_x N_y$ where x and y are positive numbers.

12 Claims, 1 Drawing Sheet

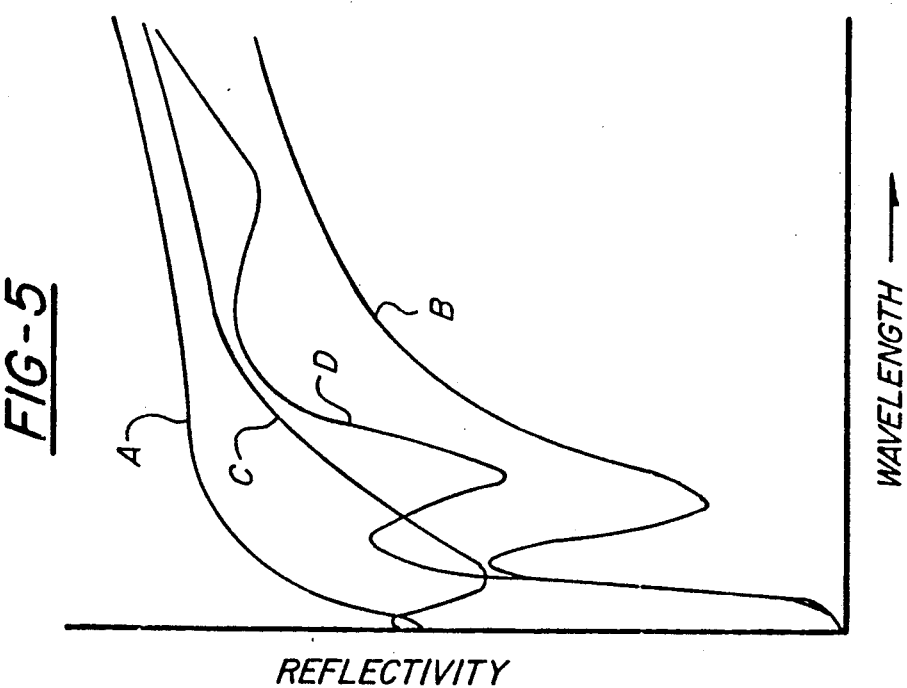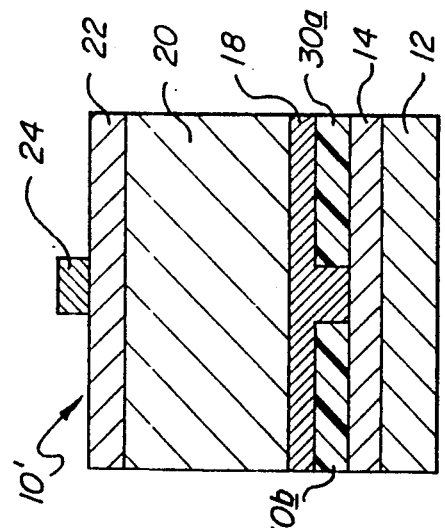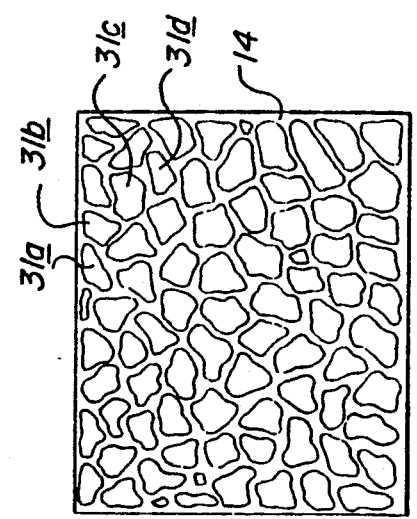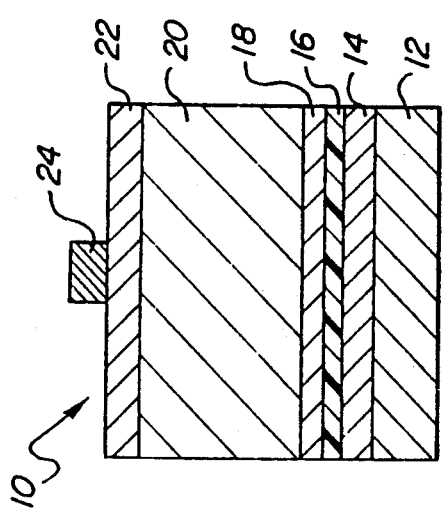

PROTECTIVE LAYER FOR THE BACK REFLECTOR OF A PHOTOVOLTAIC DEVICE

FIELD OF THE INVENTION

This invention relates generally to semiconductor devices, and more particularly, to (1) improved thin film photovoltaic devices incorporating a protective layer which is adapted to substantially maintain the high reflectivity of the underlying reflective layer; and (2) methods of fabricating improved photovoltaic devices which incorporate such a protective layer.

BACKGROUND OF THE INVENTION

The improved photovoltaic devices disclosed herein exhibit increased operational efficiency over the prior art due to improved reflectivity of the underlying reflective layer. Also disclosed are methods for the fabrication of the improved photovoltaic devices. The present invention has particular applicability to (1) large area, thin film, amorphous photovoltaic devices wherein the active semiconductor elements thereof are deposited onto a substrate electrode as relatively thin layers which are subsequently covered by a second electrode, and (2) the fabrication of such thin film, large area photovoltaic devices from amorphous semiconductor alloys.

Single crystal photovoltaic devices, especially crystalline silicon photovoltaic devices, have been utilized for some time as sources of electrical power because they are inherently non-polluting, silent, and consume no expendable natural resources in their operation. However, the utility of such devices is limited by problems associated with the manufacture thereof. More particularly, single crystal materials (1) are difficult to produce in sizes substantially larger than several inches in diameter, (2) are thicker and heavier than their amorphous counterparts, and (3) are expensive and time consuming to fabricate.

Recently, considerable efforts have been made to develop systems for depositing amorphous semiconductor materials, each of which can encompass relatively large areas, and which can be doped to form p-type and n-type materials for the production of p-i-n type photovoltaic devices which are, in operation, substantially equivalent to their crystalline counterparts. It is to be noted that the term "amorphous," as used herein, includes all materials or alloys which have long range disorder, although they may have short or intermediate range order or even contain, at times, crystalline inclusions.

It is now possible to prepare amorphous silicon alloys by glow discharge deposition or vacuum deposition techniques. The silicon alloy material possesses (1) acceptably reduced concentrations of localized states in the energy gaps thereof, and (2) high quality electronic properties. Such techniques have been fully described in U.S. Pat. No. 4,226,898, entitled Amorphous Semiconductors Equivalent To Crystalline Semiconductors, issued to Stanford R. Ovshinsky and Arun Madan and issued on Oct. 7, 1980, the disclosure of which is incorporated herein by reference. As disclosed in this patent, fluorine introduced into discrete layers of the amorphous silicon semiconductor layers operates to substantially reduce the density of the localized states therein and facilitates the addition of other alloying materials, such as germanium.

Unlike crystallize silicon which is limited to batch processing for the manufacture of solar cells, amorphous silicon alloys can be deposited in multiple layers over large area substrates to form solar cells in a high volume, continuous processing system. Such continuous processing systems are disclosed in U.S. Pat. No. 4,400,409 entitled A Method Of Making P-Doped Silicon Films And Devices Made Therefrom; U.S. Pat. No. 4,410,558 entitled Continuous Amorphous Solar Cell Production System; U.S. Pat. No. 4,438,723, entitled Multiple Chamber Deposition And Isolation System And Method; U.S. Pat. No. 4,492,181 entitled Method and Apparatus For Continuously Producing Tandem Amorphous Photovoltaic Cells; and U.S. Pat. No. 4,485,125 entitled Method and Apparatus For Continuously Producing Tandem Amorphous Photovoltaic Cells; the disclosures of which are incorporated herein by reference. As disclosed in these patents, a substrate may be continuously advanced through a succession of deposition chambers, wherein each chamber is dedicated to the deposition of a specific semiconductor material. In making a photovoltaic device of p-i-n type configuration, the first chamber is dedicated for depositing a p-type semiconductor alloy, the second chamber is dedicated for depositing an i-type intrinsic amorphous semiconductor alloy, and the third chamber is dedicated for depositing an n-type semiconductor alloy.

Since each deposited layer of semiconductor alloy material, and especially the intrinsic layer, must be of high purity; (1) the deposition environment in the intrinsic deposition chamber is isolated, by specially designed gas gates, from the doping constituents within the other chambers to prevent the diffusion of doping constituents into the intrinsic chamber; (2) the substrate is carefully cleansed prior to initiation of the deposition process to remove contaminants; (3) all of the chambers which combine to form the deposition apparatus are sealed and leak checked to prevent the influx of environmental contaminants; (4) the deposition apparatus is pumped down and flushed with a sweep gas to remove contaminants from the interior walls thereof; and (5) only the purest reaction gases are employed to form the deposited semiconductor materials. In other words, every possible precaution is taken to insure that the sanctity of the vacuum envelope formed by the various chambers of the deposition apparatus remains uncontaminated by impurities, regardless of origin.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

The concept of utilizing multiple cells, to enhance photovoltaic device efficiency, was described at least as early as 1955 by E. D. Jackson in U.S. Pat. No. 4,949,498 issued Aug. 16, 1960. The multiple cell structures therein disclosed utilized p-n junction crystalline semiconductor devices. Essentially, the concept employed different band gap devices to more efficiently collect various portions of the solar spectrum and to increase open circuit voltage (Voc). The tandem cell device (by definition) has two or more cells with the light directed serially through each cell. In the first cell a large band gap material absorbs only the short wavelength light, while in subsequent cells smaller band gap materials absorb the longer wavelengths of light which pass through the first cell. By substantially matching the generated currents from each cell, the overall open circuit voltage is the sum of the open circuit voltage of each cell, while the short circuit current thereof remains substantially constant.

Most photovoltaic devices, having either single cell or multiple cell structures, preferably include a light reflecting back reflector for increasing the percentage of incident light reflected from the substrate back through the active semiconductor alloy material of the cells. It should be obvious that the use of a back reflector increases the amount of light which passes through the active semiconductor allow material thus increasing the amount of incident light which is converted to electricity, and increasing the operational efficiency of the photovoltaic device. However, all layers, other than the layers of semiconductor material, deposited atop the light incident surface of the substrate must be substantially transparent (to 350 nanometer to 1 micron light) so as to pass a high percentage of incident light from the anti-reflective coating atop the photovoltaic cell to the highly reflective surface of the back reflector from which it is redirected through and absorbed by the semiconductor layers.

The back reflector may be formed atop the deposition surface of the substrate if an opaque substrate is employed and may be either specular or diffuse. With either type of back reflector, light which has initially passed through the active body of semiconductor alloy material from which the photovoltaic device is fabricated without being absorbed on its initial pass, is redirected by the highly reflective material of the back reflector to pass, once again, through the photoactive layers. The additional pass results in increased photon absorption and charge carrier generation, thereby providing increased short circuit current.

In the case of specular back reflectors, wherein the highly reflective material is conformally deposited over a smooth surface, the unused light is generally redirected for one additional pass through the active body of semiconductor alloy material of the device.

The diffuse back reflectors scatter the light incident thereupon in addition to being redirected through the photoactive layers, thereby mandating that a portion of the redirected light travel at angles sufficient to cause the redirected light to be substantially confined within the photovoltaic device, i.e., achieve total internal reflection. This scattering is accomplished by either 1) a highly reflective material which is grown in a textured manner upon an underlying surface, 2) light scattering film layers disposed on top of a specular reflecting surface to scatter incident light. This internal reflection provides for lengthened photon paths through the active semiconductor ally material, thus increasing the operational efficiency of the photovoltaic device. Since diffuse back reflectors redirect light through the photoactive layers of the photovoltaic device at an angle, the photoactive layers appear thinner, thereby reducing charge carrier recombination, while still maintaining efficient charge carrier generation (improving short circuit current) and promoting charge carrier collection (improving the fill factor). Also textured back reflectors contribute to textured overlying layers of semiconductor alloy material. Textured semiconductor alloy material has a larger boundary surface area, thus making the path a charge carrier must travel to collection shorter, and therefore reducing the likelihood of recombination in the photoactive layers.

As should be apparent from the foregoing discussion, and since the purpose of a back reflector of a photoresponsive device is to redirect incident light for at least a second pass through the photoactive layers of material thereof, absorption of that incident light by the back reflector cannot be tolerated. The material employed as the back reflector cannot interact with, or diffuse into, the overlying layers of semiconductor alloy material. Additionally, the back reflector material cannot add series resistance to the photovoltaic device, nor can it be too soft, since softness decreases yield, while causing short circuit junctions, and interlayer peeling.

Accordingly, several different materials have been investigated for use as the back reflector in photovoltaic devices. Several are reviewed hereinbelow. For use as back reflectors, the most highly reflective material is silver which is characterized by an integrated reflectivity of about 98.5% at 700 nm. Aluminum is another highly reflective back reflector material commonly used in the fabrication of back reflectors. Aluminum has an integrated reflectivity of about 90% at 700 nm. Yet another highly reflective material has been proposed for use as a back reflector is copper which is characterized by an integrated reflectivity of about 97.5% at 700 nm. The last of the most commonly employed reflective materials from which back reflectors are fabricated, is stainless steel having an integrated reflectivity of about 45%. While stainless steel is not nearly as reflective (and indeed, was not described as "highly" reflective) as aluminum, silver, and copper, it has been utilized as a substrate material and hence remains a possible candidate when economic factors are taken into consideration.

Previous attempts to employ aluminum as the highly reflective material of a back reflector for a photoresponsive device, which included a body of amorphous silicon alloy semiconductor material, have been unsuccessful because of the interdiffusion problems alluded to herein above. More particularly, when the amorphous silicon alloy material is deposited upon highly reflective material fabricated from aluminum, interdiffusion of the silicon and the aluminum from the contiguous layers results. Obviously the photogenerating and photoconductive properties of the body of silicon alloy material, as well as the reflective properties of the back reflector suffer.

Prior attempts at utilizing copper to fabricate the highly reflective material of the back reflector for a photoresponsive device have, likewise, proven unsatisfactory. This can be traced to the incompatibility of copper to a subsequently deposited fluorinated silicon alloy semiconductor material. More specifically, fluorine from the body of fluorinated amorphous silicon alloy material would react with the highly reflective copper material to form a copper:fluoride compound. As with the aluminum:silicon compound discussed in the preceding paragraph, the copper:fluoride compound deleteriously affected both the reflective properties of the copper back reflector and the photogenerative and the photoconductive properties of the semiconductor material. And as with the aluminum back reflector material described in the preceding paragraph, even when copper was sandwiched between buffer layers of titanium, or tin oxide, of a thickness specifically tailored to prevent light absorption, the buffer layers were ineffective in sufficiently preventing interdiffusion in a manner which would maintain the desired photovoltaic properties of the semiconductor material and the reflective characteristics of the back reflector.

Prior attempts to use silver as the highly reflective material from which to fabricate the back reflectors for photoresponsive devices have also not been very successful despite the fact that the silver back reflective material presents no serious interdiffusion problems with regard to the semiconductor material. However, silver and silver alloys present their own particular problem when employed as a highly reflective back reflector material, i.e., silver due to its relatively soft nature tends to easily deform, particularly during processing subsequent to the deposition of the body of semiconductor material, thus causing shunts or shorts in the cell. Further, silver is expensive as compared to other back reflector materials such as for example aluminum.

Thin film amorphous semiconductor materials offer several distinct advantages over crystalline materials, insofar as they can be easily and economically fabricated by the newly developed mass production processes. Back reflectors commonly formed of the aforementioned highly reflective materials have further been employed in an attempt to provide a suitable light redirecting layer for photoresponsive devices. However, as demonstrated herein above, each of the highly reflective materials have significant shortcomings when used as back reflector materials.

Peeling and cracking (adhesion failure) of the body of semiconductor material from the deposition surface of the highly reflective back reflector is believed to be due to the interdiffusion of elements at the back reflector-semiconductor material interface. The elements from which the (1) highly reflective back reflector material, (2) substrate material, and (3) semiconductor material, as described supra, are fabricated, diffuse through the respective interfaces and strain, or otherwise deleteriously affect, the chemical bonds which exist between the materials from which the contiguous layers of the aforementioned interfaces are fabricated. The resultant bond strains and recombinations cause the body of semiconductor material to crack and peel off of the underlying back reflector. And even when the aforementioned adhesion promoting and diffusion limiting layers were employed to isolate the back reflector from the substrate and the body of semiconductor material, the silver, aluminum or copper material from which the highly reflective layers are fabricated, would agglomerate, thereby substantially inhibiting, if not totally preventing, the adhesion of the subsequently deposited back reflector.

In an attempt to alleviate these problems of diffusion, reflective layers have been covered with protective layers of materials, including metals and their oxides. However, the use of such diffusion inhibiting layers (also referred to as "buffer layers") was not totally effective. The layers had to be very thin in order to prevent their absorption of incident light. However, when made very thin, these layers could not effectively prevent interdiffusion. Alternatively, if the layers were deposited so as to prevent diffusion, they would be so thick as to absorb the incident light. It was further found that in order to increase the transparency of the buffer layer, the oxygen content must be increased but this increased the resistance of the buffer layer, thus decreasing photoefficiency of the device. Conversely, reduced resistance decreased the amount of light reflected from the surface of the back reflector.

Layers of resistive material have been utilized in photovoltaic devices to minimize defect regions, such as short circuits or other low resistance shunt paths between electrodes. Such buffer layers are disclosed in U.S. Pat. No. 4,598,306, entitled Barrier Layer for Photovoltaic Devices; and U.S. Pat. No. 4,532,372, also entitled Barrier Layer for Photovoltaic Devices. Such buffer layers are in the thickness range of 200–1500 Angstroms and have resistivities in the range of $10^3$ to $10^8$ ohm/cm. As disclosed, the barriers may be formed from magnesium fluoride or oxides, nitrides, and carbides of: indium, tin, cadmium, zinc, antimony, silicon, chromium, and mixtures thereof. These barrier layers form a continuous layer of increased resistance between the electrodes to decrease the flow of electrical current through defect regions therebetween. As disclosed specifically in the '372 patent, a continuous magnesium fluoride barrier layer of 200 Angstroms thickness may be utilized with advantage only in those cells which are subject to low level (i.e. room light) illumination.

It has been found that the presence of oxide layers proximate reflective layers can cause oxidation of the reflective layer thereby significantly decreasing its reflectivity. For example, a silver back reflector and a titanium oxide or tin oxide layer react to form silver oxide, which is black instead of transparent. The formation of silver oxide decreases the integrated reflectivity of the back reflector by as much as 15% thereby decreasing overall cell efficiency.

In summary, reflective layers of silver, aluminum or copper are frequently employed in solar cells. Furthermore, such cells often include barrier layers to prevent diffusion of reflective material into the semiconductor, since such diffusion can degrade the semiconductor. However, the buffer layers have been found to adversely react with the reflector material causing it to tarnish.

Thus, based upon the foregoing, it should be apparent that a need exists for a photoresponsive device having highly reflective back reflector, but which is free from problems attendant upon diffusion of reflector material into the semiconductor and/or oxidation of the reflector by a diffusion preventing buffer layer.

SUMMARY OF THE INVENTION

There is disclosed herein an improved photoresponsive device adapted to provide for the flow of electrical current in response to light energy incident thereon. The semiconductor device generally comprises an active semiconductor body sandwiched between two electrodes. On electrode is light transmissive to permit entry of light while the other electrode is light reflective and acts to cause light energy incident thereon to make multiple passes through the semiconductor body. The improvement comprises means to substantially prevent the oxidation and the subsequent decrease of reflectivity of the light reflective electrode.

In one embodiment of the present invention, the photoresponsive device includes a transparent conductive oxide buffer layer disposed atop the light reflective electrode and a protective layer operatively disposed between the light reflective electrode and the oxide layer.

One type of protective layer disclosed herein is discontinuously disposed between the light reflective electrode and the oxide layer so as to provide at least one substantially protected region on the reflective electrode operative to resist oxidation by the oxide layer and at least one substantially unprotected region on the reflective electrode operative to allow the unimpeded flow of electrical current between the electrodes. A discontinuous protective layer may be provided by forming a very thin protective layer having an average thickness of 20-50 Å. The very thin protective layer has sufficient thickness variability so as to produce a plurality of substantially unprotected regions by virtue of microscopic pockets, or discontinuities, therein.

Alternatively, a discontinuous protective layer may be provided by depositing a discontinuous pattern of protective material defining at least one substantially unprotected region positioned between the light reflective electrode and the oxide layer. Preferably, when an electrode grid is attached to the light transmissive electrode, the substantially unprotected region is positioned to spatially correspond to at least a portion of the electrode grid s as to minimize the effect of the tarnishing of the unprotected region. Disclosed herein are methods and devices embodying the present invention.

BRIEF DESCRIPTION OF THE DRAWINGS

These and other objects and aspects of the invention will become apparent in the detailed description of the invention hereinafter with respect to the drawings in which:

FIG. 1 is a cross-sectional view of a photovoltaic device structured in accord with the principles of the present invention and including a continuous protective layer therein;

FIG. 2 is a cross-sectional view of a photovoltaic device generally similar to that of FIG. 1 but including a discontinuous protective layer therein;

FIG. 3 is a top plan view of a substrate having a silver layer and a discontinuous protective layer thereupon, said discontinuous layer comprising a microscopic pattern of protective material;

FIG. 4 is a top plan view of a substrate having a silver layer thereon and including a discontinuous, microscopic pattern of protective material thereupon; and FIG. 5 is a graphic representation of the reflectivity versus wavelength for uncoated silver, silver coated with TCO, silver coated with a protective layer of the present invention and silver coated with superposed layers of the protective material and TCO.

DETAILED DESCRIPTION OF THE PREFERRED EMBODIMENT

Referring now to FIG. 1, there is shown a photovoltaic device 10 structured in accord with the principles of the present invention. The device 10 includes a substrate layer 12 which functions to support the remaining layers of the device 10. Substrate layer 12 is preferably electrically conductive so that it may function as the bottom electrode of the semiconductor device 10. Toward that end is fabricated from a metal such as stainless steel or from a composite of an insulating material such as glass, ceramic, polymers, and the like having a layer of electrically conductive material disposed thereupon. In the illustrated embodiment, the device 10 includes a back reflective layer 14 disposed upon the substrate. This layer is preferably fabricated from a highly reflective material such as silver, copper or the like and, as noted above and it functions to redirect light which has passed through the superjacent layers of the photovoltaic device 10 back through those layers for additional absorption.

Disposed atop the reflective layer 14 is a protective layer 16 structured in accord with the principles of the present invention. This layer 16, as will be described in greater detail hereinbelow, prevents the reflective layer 14 from reacting with, and being tarnished by, superjacent layers of material in the photovoltaic device. Disposed atop the protective layer 16 is a layer of transparent conductive oxide TCO material. This layer is typically fabricated from oxides of indium, zinc, titanium and other transition metals either singly or in combination. The TCO layer 18 functions to prevent diffusion of the back reflector metal 14 into superjacent semiconductor layers. In some instances, this layer 18 also acts as a current-limiting buffer as noted above. In yet other instances it has been found advantageous to texturize the TCO layer 18 to further aid in trapping of light within the photovoltaic device. Immediately atop the TCO layer 18 is a semiconductor body 20 which is operative to generate a flow of electrical current in response to the absorption thereby. Atop the semiconductor body 20 is a layer of top electrode material 22 which is preferably a light transparent material such as TCO material. The top electrode layer 22 collects photogenerated current and as illustrated, the device 10 preferably includes a current collecting structure 24 such as a grid or bus bar system which is fabricated from a highly conductive material such as a metal and which functions to decrease series resistance of the device 10 by collecting photogenerated currents and efficiently carrying them to a device terminal.

The photovoltaic body 20 may comprise one or more layers of semi-conductor material configured to form in a p-n, p-i-n or a Schottky barrier junction. As is well known to those skilled in the art, by the use of the appropriate semi-conductor layers, an internal field may be generated within the semi-conductor body which serves to separate photogenerated electron-hole pairs and convey them to opposite faces thereof for collection by the appropriate electrodes. In one particular preferred embodiment of the present invention, the semi-conductor body 20 comprises a plurality of layers of disordered silicon alloy material and in one particularly preferred configuration comprises a plurality of stacked p-i-n type photovoltaic cells. It is to be understood that the principles of the present invention may be practiced in conjunction with a wide variety of semi-conductor materials and device configurations and toward that end, the photogenerative portion of the device will simply be referred to as a photovoltaic body 20.

As mentioned hereinabove, the reflective layer 14 is preferably a silver layer and as such is very prone to diffuse into the semiconductor body 20. This diffusion can degrade the operation of the semiconductor body and toward that end a barrier layer 18 of a TCO material is included in the device 10. The barrier layer adversely interacts with the silver reflective layer 14 so as to decrease its reflectivity. It is suspected that such interaction involves migration of oxygen from the TCO layer 18 into the silver layer 14 where it causes oxidation.

In accord with the present invention, a protective layer 16 is interposed between the silver layer 14 and the TCO layer 18. The protective layer 16 operates to prevent oxidation of the silver 14 while not substantially interfering with the flow of electrical current through the device 10.

In one embodiment, the protective layer 16 comprises a continuous layer formed of magnesium fluoride and having a thickness in the range of 200–500 Å. In other embodiments, the layer is formed of a nitride material such as silicon nitride or titanium nitride.

The preferred materials of the protective layer are generally electrically insulating. However, it has been found that relatively thin layers, i.e., layers of no more than 500 Å thickness, can provide sufficient protection to preserve the silver from oxidation and such layers do not present a significant enough resistance to impair the operation of the photovoltaic device, particularly when the device operates at a fairly high voltage, as is typical of devices having semi-conductor bodies which include a number of stacked photovoltaic cells.

In accord with the present invention, it has been found that the series resistance of the photovoltaic device may be further decreased by providing a discontinuous protective layer. Referring now to FIG. 2, there is shown a photovoltaic device 10' generally similar to that of FIG. 1 but including a discontinuous protective layer 30 therein. The remaining layers of the FIG. 2 device are identical to those of FIG. 1 and are referred to by identical reference numerals. What is notable about the FIG. 2 device is that the protective layer 30 includes two separate segments 30a,30b. This arrangement allows a portion of the silver layer 14 to be in direct contact with the TCO layer 18 and thus provides a relatively low resistance current path between the semi-conductor body 20 and the bottom electrode 12. It is to be understood that the region of the silver layer 14 which is not covered by the protective layer 30 will be tarnished to some degree by the overlying TCO layer 18; however, if such regions are relatively small, the overall effect on the efficiency of the photovoltaic device will be correspondingly small. Furthermore, it has been found that such regions may be advantageously placed beneath the current collecting structure 24 with negligible effect on cell efficiency. This, is because the current collecting structure 24 is opaque and shades the subjacent regions of the device; therefore, any decreased reflectivity of the portion of the silver layer beneath said structure is of no consequence.

Referring now to FIG. 3, there is shown a top plan view of a photovoltaic device substrate having a layer of silver 14 disposed thereupon and further including a discontinuous layer of protective material comprising a number of separated segments 30a–30h. The pattern of regions 30a–30h of protective material is configured so that those regions of the silver layer 14 which are unprotected correspond to the busbar structure of the photovoltaic device which will subsequently be disposed thereupon.

Another approach to the fabrication of a discontinuous protective layer is set forth in FIG. 4. As illustrated therein, a substrate generally similar to that of FIG. 3 is coated with a silver layer 14 and further includes a plurality of small, discrete regions of protective material (for example, regions 31a–31d) formed thereupon. These regions are typically of microscopic size and are randomly scattered over the surface of the silver layer 14 and in the illustrated embodiment, the region 31 cover approximately 95% of the silver layer 14. In this embodiment, no attempt is made to align the unprotected regions with any bus grid structure; however, the fact that only a small portion of the silver layer 14 is unprotected results in a very small impact on cell efficiency. It has been found that a silver reflective layer 14 having an integrated reflectivity factor of 94% will decrease in overall reflectivity by only 0.7% when 5% of its surface oxidizes to an 80% integrated reflectivity.

Most preferably, the discontinuous protective layer of the FIG. 4 embodiment is prepared by depositing a relatively thin (i.e., 20–50 Å thickness layer of protective material). A layer of this thinness will deposit in a discontinuous manner and by control of thickness, the degree of coverage may be selected. It is to be noted that the discontinuous nature of the deposit is apparent only on a microscopic scale and in the FIG. 4 embodiment, the features have been very greatly enlarged to show the detail.

EXPERIMENTAL

The efficiency of the present invention was demonstrated by coating a silver layer with various combinations materials and measuring the reflectivity thereof as a function of wavelength. The data is summarized in FIG. 5. The silver employed in this series of experiments comprises a layer of silver disposed upon a stainless steel support. The silver is approximately 2000 to 4000 Å thick and was prepared in accord with well known techniques by the evaporation of silver under vacuum conditions. Curve A of FIG. 5 represents the reflectively of the uncoated silver layer. The silver layer was coated with a layer of zinc oxide in a conventional vacuum evaporation process. The zinc oxide layer was approximately 500 Å thick and after coating the structure was heated at 300° C. for five minutes. The reflectivity of this structure is shown at Curve B in FIG. 5. It will be noted that the presence of the zinc oxide significantly decreased the reflectivity of the silver layer. For comparison, an identical silver substrate was coated with 500 Å of magnesium fluoride and heated at 300° C. for five minutes. As illustrated in FIG. 5, Curve C, the effect on overall reflectivity is very small. When a zinc oxide layer, corresponding to that of Curve B, was deposited atop the magnesium fluoride layer of the Curve C sample, overall reflectivity was still extremely good as is shown by Curve D. It is to be noted that curves B and D include minima at approximately 450 nm; these features are the result of interference effects in the layers.

The conclusion from the data of FIG. 5 is that the presence of the relatively thin protective layer prevents the oxidation of the silver. Similar results have been found in combination with textured silver layers as well as other protective materials including titanium nitride and silicon nitride.

From the foregoing description of the preferred embodiment it can be seen that various alternative embodiments of the invention ca be anticipated without departure from the scope of the invention as defined in the following claims.

We now claim:

1. In a photoresponsive device comprising a light reflective electrode formed at least partially of silver; a transparent conductive oxide layer disposed atop said light reflective electrode; a photovoltaic semi-conductor body disposed atop said transparent conductive oxide layer said semi-conductor body being operative to provide for a flow of electrical current in response to light energy incident thereon; and a light transmissive electrode disposed atop said semi-conductor body, the improvement comprising:

a discontinuous protective layer operatively disposed between said light reflective electrode and the transparent conductive oxide layer, so as to provide a substantially protected region on said reflective electrode and a substantially unprotected region on said reflective electrode said discontinuous protective layer being operative to substantially prevent the oxidation of said light reflective electrode by said transparent conductive oxide layer while allowing the flow of electrical current between said light reflective electrode and said light transmissive electrode.

2. The device as in claim 1, wherein said light reflective electrode comprises a stainless steel substrate having a silver coating thereon.

3. The device as in claim 1, wherein
said protective layer is formed of a material having an electrical resistivity greater than that of the reflective electrode.

4. The device as in claim 3, wherein
said protective layer is formed from a material selected from the group consisting of: $MgF_2$, nitrides of silicon, nitrides of titanium, and combinations thereof.

5. The device as in claim 1, wherein
said protective layer is a microscopically discontinuous layer having an average thickness of 20-50 Å.

6. The device as in claim 1, wherein
said substantially unprotected region is positioned in a predetermined location between said light reflective electrode and the oxide layer.

7. The device as in claim 6, wherein
said light transmissive electrode includes a bus grid structure associated therewith with at least a portion of said substantially unprotected region positioned to underlie at least a portion of said bus grid structure.

8. The device of claim 1, wherein said protective layer is substantially continuous.

9. The device of claim 1, wherein said protective layer is formed of $MgF_2$.

10. The device of claim 9, wherein said $MgF_2$ protective layer has an average thickness of 300-500 Å.

11. A photovoltaic device comprising:
a metallic substrate electrode having a light reflective, silver coating thereupon;
a layer of an electrically conductive, transparent oxide disposed in a superposed relationship with said silver coating;
a protective layer interposed between at least portions of said silver coating and said layer of electrically conductive, transparent oxide, said protective layer being operative to prevent oxidation of said silver coating by said layer of electrically conductive transparent oxide;
a photovoltaic semiconductor body disposed atop said layer of electrically conductive, transparent oxide, said semiconductor body being operative to provide for a flow of electrical current in response to the absorption of light thereby; and
a light transmissive electrode disposed atop said semiconductor body.

12. The device of claim 11, wherein said protective layer is formed from a material selected from the group consisting of: $MgF_2$, nitrides of silicon, nitrides of titanium, and combinations thereof.

* * * * *